US007935984B2

United States Patent
Nakano (10) Patent No.: US 7,935,984 B2
(45) Date of Patent: May 3, 2011

(54) COMPOUND SEMICONDUCTOR EPITAXIAL SUBSTRATE AND METHOD FOR PRODUCING THE SAME

(75) Inventor: Tsuyoshi Nakano, Sodegaura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 54 days.

(21) Appl. No.: 12/227,794

(22) PCT Filed: May 28, 2007

(86) PCT No.: PCT/JP2007/061236
§ 371 (c)(1),
(2), (4) Date: Nov. 26, 2008

(87) PCT Pub. No.: WO2007/139218
PCT Pub. Date: Dec. 6, 2007

(65) Prior Publication Data
US 2009/0166642 A1    Jul. 2, 2009

(30) Foreign Application Priority Data
May 31, 2006   (JP) .................................. 2006-150768

(51) Int. Cl.
*H01L 29/66*   (2006.01)
(52) U.S. Cl. ......................................... 257/192; 438/87
(58) Field of Classification Search .................. 257/192
See application file for complete search history.

(56) References Cited

U.S. PATENT DOCUMENTS
5,949,096 A    9/1999   Ohkubo et al.
(Continued)

FOREIGN PATENT DOCUMENTS
JP    02-246344    10/1990
(Continued)

OTHER PUBLICATIONS

Otoki et al., "Epitaxial growth technology for compound semiconductor microwave devices," English language translation of excerpt from *2006 IEICE General Conference*, CT-1-3, pp. SS-3 and SS-4.

(Continued)

*Primary Examiner* — Laura M Menz
*Assistant Examiner* — Sonya D McCall Shepard
(74) *Attorney, Agent, or Firm* — Fitch, Even, Tabin & Flannery

(57) ABSTRACT

There are provided a higher-performance compound semiconductor epitaxial substrate having improved electron mobility characteristics and its production method. The compound semiconductor epitaxial substrate includes a channel layer in which electrons travel and an epitaxial layer on each of a front side and a back side of the channel layer, wherein a total p-type carrier concentration A ($/cm^2$) per unit area in the epitaxial layer on the back side of the channel layer and a total p-type carrier concentration B ($/cm^2$) per unit area in the epitaxial layer on the front side of the channel layer satisfy the following expression (1):

$$0 < A/B \leq 3.5 \qquad (1)$$

wherein A=(a concentration of all p-type carriers in an active state due to an acceptor impurity contained in the epitaxial layer on the back side of the channel layer)×(a total thickness of the epitaxial layer on the back side), and B=(a concentration of all p-type carriers in an active state due to an acceptor impurity contained in the epitaxial layer on the front side of the channel layer)×(a total thickness of the epitaxial layer on the front side).

6 Claims, 4 Drawing Sheets

U.S. PATENT DOCUMENTS

| | | |
|---|---|---|
| 6,198,116 B1 * | 3/2001 | Cerny et al. .................. 257/194 |
| 2004/0079965 A1 | 4/2004 | Tamura et al. |
| 2004/0188708 A1 | 9/2004 | Otsuka et al. |
| 2006/0113563 A1 | 6/2006 | Osada et al. |

FOREIGN PATENT DOCUMENTS

| | | |
|---|---|---|
| JP | H02-246344 A | 10/1990 |
| JP | 06-021106 | 1/1994 |
| JP | H06-021106 A | 1/1994 |
| JP | 11-103046 | 4/1999 |
| JP | 2001/111038 | 4/2001 |
| JP | 2004-146588 | 5/2004 |
| JP | 2004-165314 A | 6/2004 |
| JP | 2004-207471 | 7/2004 |

OTHER PUBLICATIONS

Chinese Office Action.
Micronanoelectric Technology, pp. 26-28 (Jun. 2003).
UK Examination Report under Section 18(3) corresponding with Application No. GB0821002.3, dated Dec. 10, 2010.

* cited by examiner

COMPOUND SEMICONDUCTOR EPITAXIAL SUBSTRATE AND METHOD FOR PRODUCING THE SAME

CROSS-REFERENCE TO RELATED APPLICATIONS

This is a U.S. National Phase of International Application PCT/JP2007/061236, filed May 28, 2007, and claims the benefit of priority under 35 U.S.C. §119 based on Japanese Application No. 2006-150768, filed May 31, 2006, the entire disclosures of which applications are hereby incorporated herein by reference.

TECHNICAL FIELD

The present invention relates to a compound semiconductor epitaxial substrate which is preferable for use in the production of various electronic devices such as a field effect transistor (hereinafter referred to as FET), a high electron mobility transistor (hereinafter referred to as HEMT), and the like, and a method for producing the same.

BACKGROUND ART

In recent years, with an advantage of being capable of a super-high-speed and high-frequency operation, various electronic devices using a group III-V compound semiconductor mainly represented by GaAs have been dramatically developed by being used in high-frequency equipment such as a mobile phone, a satellite broadcasting receiver, and the like, and have since continued to make a steady progress in the development.

In general, in order to produce an electronic device using a compound semiconductor, there is used a semiconductor substrate obtained by laminating crystal layers having required characteristics by various methods such as an ion implantation method, a diffusion method, and an epitaxial growth method on a single crystal substrate. Among the methods described above, the epitaxial growth method has been widely used in the production of the semiconductor substrate of this type since it is possible to control not only the amount of an impurity but also a composition and a thickness of a crystal in an extremely wide range with high precision.

As the epitaxial growth method, a liquid phase method, a vapor phase method, and a molecular beam epitaxy method, which is a type of vacuum deposition methods, are well known. Among them, the vapor phase method is industrially widely used since it can process a large number of substrates with excellent controllability. In particular, a metal-organic chemical vapor deposition method (hereinafter referred to as MOCVD method) wherein a crystal growth is performed by initiating thermal decomposition over a substrate using an organic metal compound or a hydride of atomic species constituting an epitaxial layer as a material has a wide range of applicable substances, is suitable for the precise control of the composition and thickness of the crystal, and is excellent in mass productivity so that it has been widely used in recent years.

An epitaxial growth substrate for use in the production of electronic devices such as the FET, the HEMT, and the like is produced by growing a crystal layer of GaAs, AlGaAs, InGaAs, or the like each having required electronic characteristics on a GaAs substrate with a required structure by using, e.g., the MOCVD method.

In a planar electronic device such as the FET, the HEMT, or the like, there is grown an active layer which activates transistor characteristics by controlling electrons which laterally travel in a channel layer formed of a GaAs layer or an InGaAs layer using an electric field resulting from a gate electrode, and a buffer layer composed of the GaAs layer, an AlGaAs layer or the like is typically grown between the active layer and a semi-insulating substrate.

The object of inserting the buffer layer between the active layer and the semi-insulating substrate is to suppress the influence of an impurity at the interface between the epitaxial layer and the substrate, the influence of the substrate itself, and electron leakage from the active layer, and the buffer layer has a highly important role to retain the characteristics of the electronic device.

In the case where various epitaxial layers are grown on the substrate by the MOCVD method, since a group III material such as Ga, Al, or the like is supplied as the organic metal compound, it is known that carbon (C) is included into the grown crystal when the material is thermally decomposed to be grown as the epitaxial layer. Further, it is known that a thermal decomposition behavior of the organic metal compound is changed and the concentration of C to be included in the grown crystal is changed as well by a so-called group V/group III material flow rate ratio, which is a ratio between flow rates of a group III material such as gallium (Ga), aluminum (Al), or the like and a group V material such as arsenic (As), phosphorus (P), or the like. When the epitaxial layer of GaAs, AlGaAs, or the like is grown, as the epitaxial growth is performed by setting the group V/group III material flow rate ratio to a smaller value, the obtained epitaxial layer has a higher C concentration. Since C behaves as an acceptor impurity in the GaAs crystal or the AlGaAs crystal, the obtained epitaxial layer is a crystal layer having a p-type carrier density as a background concentration.

When the compound semiconductor epitaxial substrate for use in the production of the planar electronic device having the channel layer in which electrons travel is produced by the MOCVD method, a crystal layer having a background p-type carrier density such as a Schottky layer, a spacer layer, or the like is placed on the front side (the side opposite to a template) of the channel layer, while a crystal layer having the background p-type carrier density such as the spacer layer, the buffer layer, or the like is placed on the back side (the same side as the template) of the channel layer.

Therefore, when an epitaxial growth substrate for the electronic device such as the FET, the HEMT, or the like is produced by the MOCVD method, a plurality of crystals having the background p-type carrier density are grown.

In the production of the epitaxial substrate for use in the production of the electronic device such as the FET, the HEMT, or the like, in the case of, e.g., the structure of a pseudomorphic-HEMT (hereinafter referred to as p-HEMT) which is a HEMT using an InGaAs strained layer as the channel layer in which electrons travel, the mobility of electrons in the channel layer at room temperature (300 K) is about 8250 cm$^2$/Vs (The institute of Electronics, Information and Communication Engineers, Proceedings of the IEICE General Conference 2006, CT-1-3 "Epitaxial growth technology for compound semiconductor microwave devices", 25, Mar. 2006, Kokushikan University), and it has been difficult to achieve a value higher than the value mentioned above. Accordingly, there have been limitations on achieving reductions in transient resistance and power loss of the electronic device, and increasing the levels of characteristics of the electronic device to levels higher than the present levels by increasing the electron mobility.

Conventionally, various proposals have been made for an improvement in the electron mobility. For example, it is proposed in JP-A-06-21106 that the electron mobility is improved by optimizing the In composition of the InGaAs strained layer used as the channel layer and the thickness of the InGaAs layer by using a given relational expression in the p-HEMT structure. In addition, there is proposed in JP-A-02-246344 that a two-dimensional electron gas concentration and the electron mobility are improved by inserting a spacer layer made of the AlGaAs layer and the GaAs layer between the InGaAs strained layer used as the channel layer and an n-AlGaAs electron supply layer to optimize growth conditions in the p-HEMT structure. Further, there is proposed in JP-A-2004-207471 that the electron mobility is improved by combining an increase in the In composition of the InGaAs strained layer and the spacer layer made of the AlGaAs layer and the GaAs layer to optimize growth conditions.

However, from the viewpoint that the characteristics of the electronic device are improved as the two-dimensional electron gas concentration and the electron mobility have higher values in the compound semiconductor epitaxial substrate having the channel layer in which electrons travel such as the epitaxial substrate having the p-HEMT structure, the respective values of the two-dimensional electron gas concentration and the electron mobility are not satisfactory in the field to which devices for high frequency or the like are applied to, and therefore an epitaxial substrate having improved electron mobility characteristics with high two-dimensional electron gas concentration and high electron mobility has been in demand.

DISCLOSURE OF THE INVENTION

An object of the present invention is to provide a higher-performance compound semiconductor epitaxial substrate having improved electron mobility characteristics and a method for producing the same.

The present inventors have achieved the present invention as a result of a dedicated study for solving the foregoing problems.

That is, the present invention provides a compound semiconductor epitaxial substrate for a planar device including a channel layer in which electrons travel, and an epitaxial layer on each of a front side and a back side of the channel layer, wherein a total p-type carrier density A ($/cm^2$) per unit area in the epitaxial layer on the back side of the channel layer and a total p-type carrier density B ($/cm^2$) per unit area on the front side of the channel layer satisfy the following expression (1):

$$0 < A/B \leq 3.5 \quad (1)$$

wherein A=(a concentration of all p-type carriers in an active state due to an acceptor impurity contained in the epitaxial layer on the back side of the channel layer)×(a total thickness of the epitaxial layer on the back side), and B=(a concentration of all p-type carriers in an active state due to an acceptor impurity contained in the epitaxial layer on the front side of the channel layer)×(a total thickness of the epitaxial layer on the front side).

The present invention provides a compound semiconductor epitaxial substrate with a pseudomorphic-high electron mobility transistor structure having an InGaAs layer as a channel layer in which electrons travel, wherein the electron mobility of the InGaAs layer at room temperature (300 K) is not less than 9000 $cm^2/Vs$.

In addition, the present invention provides a method for producing the compound semiconductor epitaxial substrate including the step of growing the epitaxial layer on a template by a MOCVD method.

EXPLANATION OF MARKS 1 semi-insulating GaAs template
2 buffer layer
3 back-side active layer
4 channel layer
5 front-side active layer
6 contact layer
11 semi-insulating GaAs template
12, 13 buffer layer
14 back-side electron supply layer
15, 16 back-side spacer layer
17 channel layer
18, 19 front-side spacer layer
20 front-side electron supply layer
21 Schottky layer
31 semi-insulating GaAs template
32 p-type carrier density measurement layer (AlGaAs, thickness: 2000 nm, carrier density: 1 to 200E15/$cm^3$)

MODE OF CARRYING OUT THE INVENTION

Compound Semiconductor Epitaxial Substrate

Figure 2:
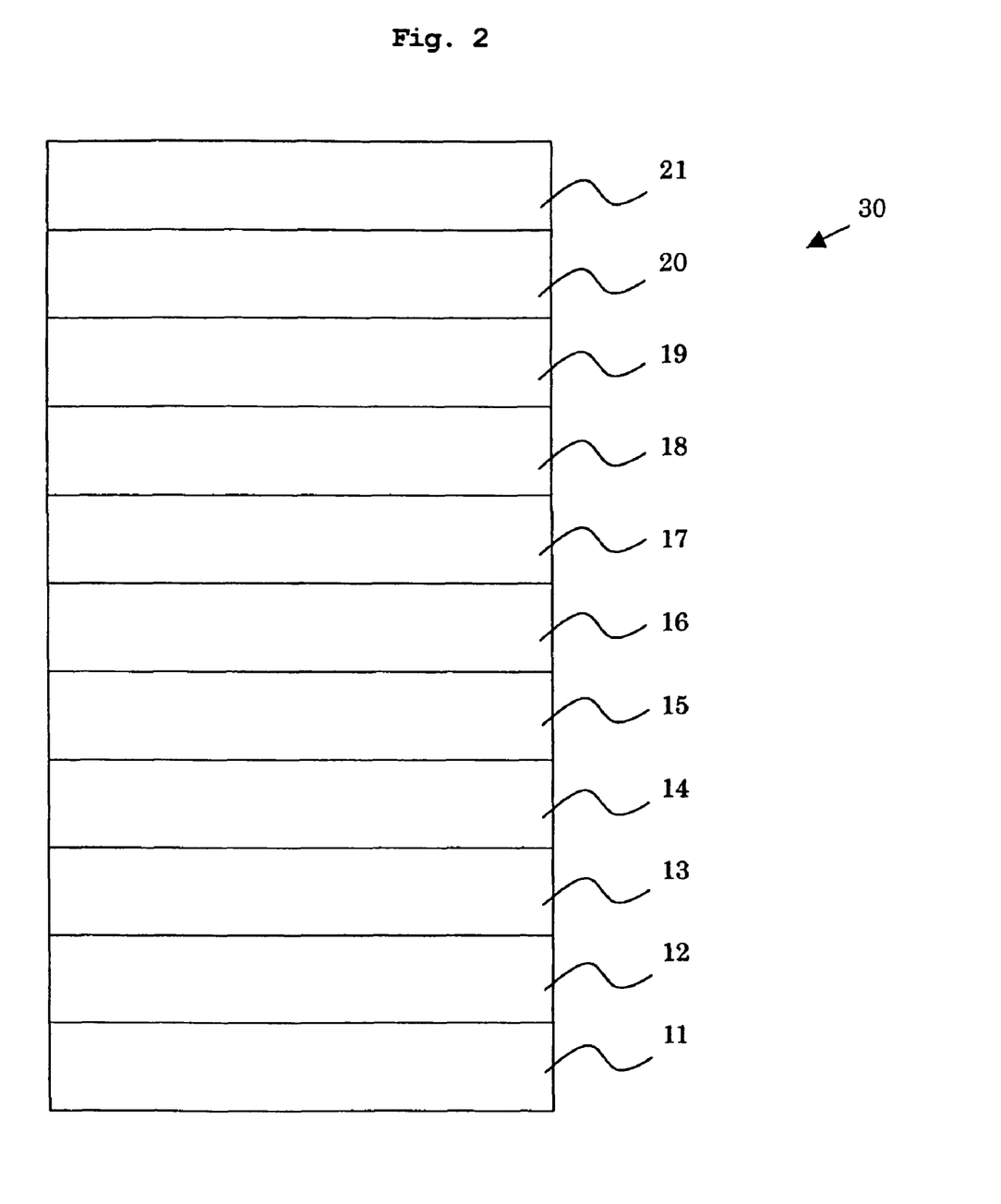
FIG. 2 illustrates a layer structure of a compound semiconductor epitaxial substrate shown in an example.

A compound semiconductor epitaxial substrate according to the present invention has a channel layer in which electrons travel, and epitaxial layers on the front side and the back side of the channel layer, and normally has a template, a buffer layer, the channel layer, a front-side active layer (a spacer layer, an electron supply layer, a Schottky layer, and the like), and a contact layer in this order. The compound semiconductor epitaxial substrate may have a back-side active layer (the electron supply layer, the spacer layer, and the like) between the channel layer and the buffer layer. There may be two or more of the buffer layers and the spacer layers as shown in FIG. 2.

In the compound semiconductor epitaxial substrate, a ratio A/B, which is a ratio between a total p-type carrier density A ($/cm^2$) per unit area in the epitaxial layers on the back side of the channel layer calculated from (a concentration of all p-type carriers in an active state due to an acceptor impurity contained in the epitaxial layers on the back side of the channel layer)×(a total thickness of the epitaxial layers on the back side)) and a total p-type carrier density B ($/cm^2$) per unit area calculated from (a concentration of all p-type carriers in an active state due to an acceptor impurity contained in the epitaxial layers on the front side of the channel layer)×(a total thickness of the epitaxial layers on the front side), is more than 0, preferably not less than 0.5, and not more than 3.5, preferably not more than 1.5.

In the compound semiconductor epitaxial substrate which satisfies the above-mentioned expression (1), the total concentration of the p-type carriers in the active state which are present in the epitaxial layers (the front-side active layer, the contact layer, and the like) on the front side of the channel layer and the total concentration of the p-type carriers in the active state which are present in the epitaxial layers (the buffer layer, the back-side active layer, and the like) on the back side of the channel layer are provided in a well-balanced state. In the compound semiconductor epitaxial substrate, the state where electrons traveling in the channel layer travel in the vicinity of a boundary between the channel layer and another layer in contact with the channel layer is improved due to a band lineup so that the electrons travel in the vicinity of the center in the channel layer. As a result, the mobility of the electrons traveling in the channel layer is improved.

In the compound semiconductor epitaxial substrate, for example, by increasing the p-type carrier density of the buffer layer and, on the other hand, reducing the thickness thereof, the total concentration of the p-type carriers in the active state which are present in the epitaxial layers on the back side can be reduced and at the same time, the influence of the impurity at the interface between the epitaxial layer and the substrate is suppressed, and electron leakage to the substrate is suppressed as well. The compound semiconductor epitaxial substrate of this type is not only excellent in the electron mobility characteristics but also capable of a reduction in the amount of usage of a material for the growth of the buffer layer (e.g., a group V material) because of the thin thickness thereof. Normally, since the group V material is relatively expensive, the compound semiconductor epitaxial substrate of this type is advantageous in terms of cost.

The compound semiconductor epitaxial substrate according to the present invention having the InGaAs layer as the channel layer in which electrons travel is suitable as a compound semiconductor epitaxial substrate with the pseudomorphic-high electron mobility transistor structure, and has the electron mobility in the InGaAs layer at room temperature (300 K) of not less than 9000 $cm^2/Vs$.

An embodiment of the compound semiconductor epitaxial substrate according to the present invention will be described with reference to FIG. 1. A layer structure of a compound semiconductor epitaxial substrate 10 illustrated in FIG. 1 includes a template 1 comprising semi-insulating GaAs, a buffer layer 2 comprising GaAs or AlGaAs, a back-side active layer 3 comprising GaAs, AlGaAs, or InGaP, a channel layer 4 comprising InGaAs, InGaP, or GaAs, a front-side active layer 5 comprising GaAs, AlGaAs, or InGaP, and a contact layer 6 comprising GaAs or InGaAs in this order.

Figure 1:
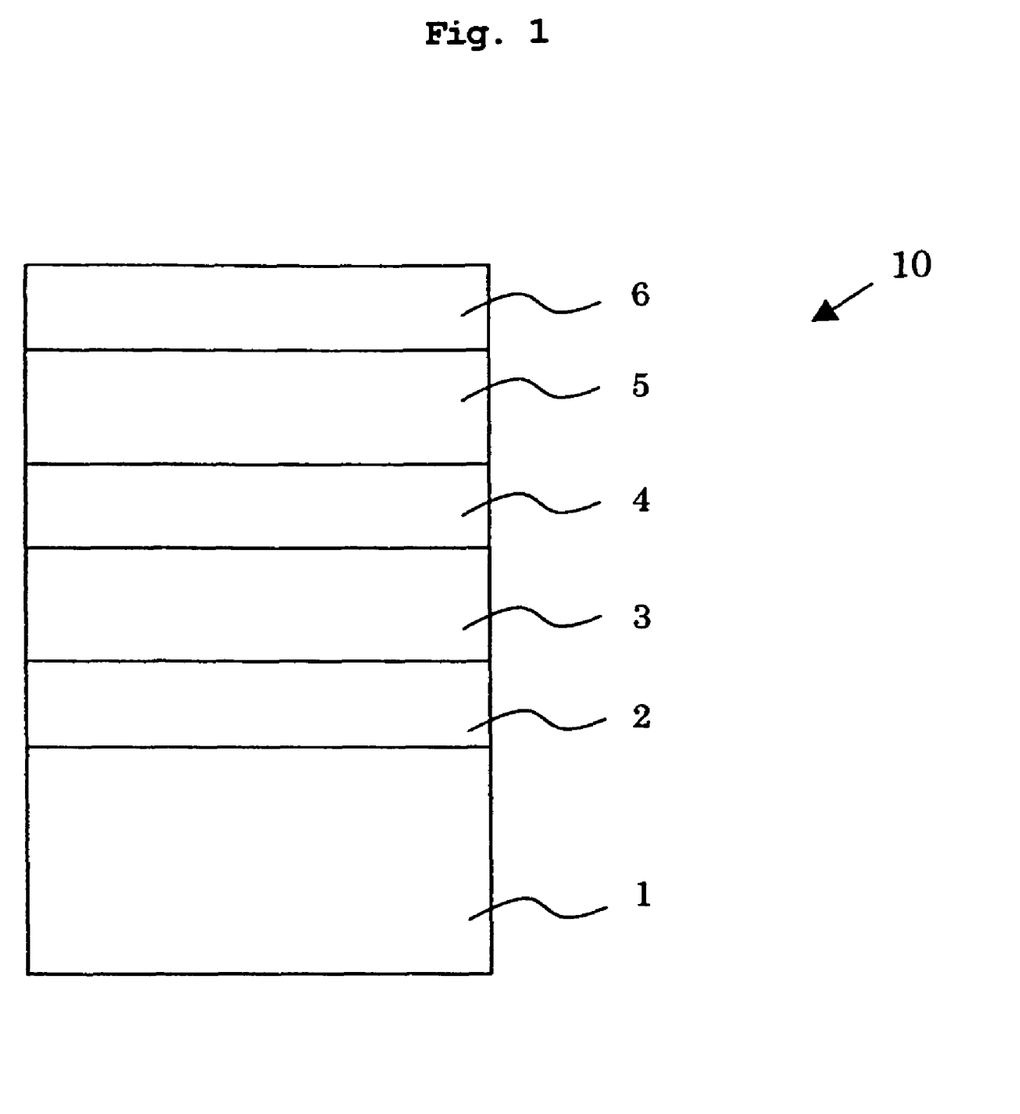
FIG. 1 illustrates a layer structure of a compound semiconductor epitaxial substrate according to an embodiment of the present invention.

The compound semiconductor epitaxial substrate 10 illustrated in FIG. 1 may be produced by, e.g., growing the individual layers on the template 1 by a MOCVD method, and has the layer structure as a compound semiconductor epitaxial substrate for use in the production of a planar device having the channel layer for the travel of electrons, and also has a structure of a compound semiconductor epitaxial substrate for use in the production of the p-HEMT.

When the total p-type carrier density A ($/cm^2$) per unit area is [the concentration of the p-type carriers in the active state due to an acceptor impurity contained in the back-side active layer 3 and the buffer layer 2 on the back side of the channel layer 4]×[the total thickness of the back-side active layer 3 and the buffer layer 2)], and the total p-type carrier density B ($/cm^2$) per unit area is calculated from [the concentration of the p-type carriers in the active state due to an acceptor impurity contained in the front-side active layer 5 and the contact layer 6 on the front side of the channel layer 4]×[the total thickness of all of the epitaxial layers], the compound semiconductor epitaxial substrate 10 illustrated in FIG. 1 is constructed such that the ratio A/B is in the range described above.

As described above, in the compound semiconductor epitaxial substrate 10, the total concentration of the p-type carriers in the active state in the epitaxial layers on the front side and the total concentration of the p-type carriers in the active state in the epitaxial layers on the back side are in a well-balanced state, and therefore the traveling state of electrons in the channel layer 4 is improved so that unprecedented high electron mobility is achieved.

Normally, since the carrier density in the electron supply layer on the back side can not be increased due to the occurrence of a crystal defect, the carrier density in the electron supply layer on the front side tends to be high. Consequently, electrons traveling in the channel layer 4 are apt to be closer to the front side so that it is possible to reduce the carrier density in the electron supply layer on the back side to an extremely low value when compared with the carrier density in the electron supply layer on the front side.

Method for Producing Compound Semiconductor Epitaxial Substrate

A compound semiconductor substrate may be produced by using, e.g., a MOCVD method, and may be produced by growing epitaxial layers on a template by the MOCVD method.

A method for producing the compound semiconductor epitaxial substrate 10 will be described hereinbelow.

A template 1 as a high-resistance semi-insulating GaAs single-crystal substrate is loaded on a heating platform of a crystal growth chamber after degreasing, etching, rinsing, and drying are performed with respect to the surface thereof. The high-resistance semi-insulating GaAs single-crystal substrate may be prepared by a LEC (Liquid Encapsulated Czochralski) method, a VB (Vertical Bridgeman) method, a VGF (Vertical Gradient Freezing) method, or the like. The GaAs single-crystal substrate normally has an angle of inclination from about 0.05° to about 10° with respect to one crystallographic plane direction. After the inside of the crystal growth chamber is fully substituted by high-purity hydrogen, the heating of the template 1 is started. The temperature of the substrate during the crystal growth is normally in a range of about 500° C. to about 800° C. When the temperature of the template 1 is stabilized at a proper temperature, an arsenic material, and then a gallium material and an aluminum material or an indium material may be introduced into the chamber to grow the GaAs layer, the AlGaAs layer, or the InGaAs layer. By appropriately growing desired layers on the template 1, the compound semiconductor epitaxial substrate 10 is obtained.

The material for the epitaxial growth preferably includes an organic metal and/or a hydride. The arsenic material includes, e.g., arsenic trihydride (arsine), alkyl arsine obtained by substituting hydrogen of arsine with a 1-4C alkyl group, and a trialkylated compound or a trihydride in which a 1-3C alkyl group or hydrogen combines with arsenic.

In the growth of the InGaP layer, a phosphorous material, the gallium material and the indium material may be introduced into the chamber.

As a dopant for an n-type carrier, a hydride of silicon, germanium, tin, sulfur, selenium, or the like, or an alkylated compound having the 1-3C alkyl group may be used.

At the time of the epitaxial growth, by controlling a predetermined time and the supply of each material, the compound semiconductor epitaxial substrate 10 with a desired structure having the buffer layer 2, the back-side active layer 3, the channel layer 4, the front-side active layer 5, and the contact layer 6 on the template 1 is obtained. The supply of the materials may be performed by adjusting a group V/group III material flow rate in accordance with the composition in each layer. For example, it may be performed by adjusting the group V/group III material flow rate in consideration of the balance between the total p-type carrier density on the front side of the channel layer 4 and the total p-type carrier density on the back side thereof. Typically, since the total thickness of the back-side active layer 3 and the buffer layer 2 is large compared with the thickness of the front-side active layer 5, the group V/group III material flow rate when the back-side active layer 3 and the buffer layer 2 are grown may be set to be large compared with the one when the front-side active layer 5 is grown.

The Epitaxial growth may be performed under the condition that the ratio A/B wherein A is the total p-type carrier density per unit area [=the concentration of the p-type carriers in the active state×the thickness] in the back-side active layer 3 and the buffer layer 2 and B is the total p-type carrier density per unit area [the concentration of the p-type carriers in the active state×the thickness] in the front-side active layer 5 and the contact layer 6 is more than 0 and not more than 3.5.

After the supply of the materials is stopped to end the crystal growth and a cooling process is performed, the compound semiconductor epitaxial substrate 10 with individual epitaxial layers laminated thereon may be taken out of the chamber.

Example

The present invention will be described by using an example. However, the present invention is not limited to the present example.

A compound semiconductor epitaxial substrate 30 for a p-HEMT illustrated in FIG. 2 was produced by growing individual layers on the semi-insulating GaAs template. The compound semiconductor epitaxial substrate 30 illustrated in FIG. 2 comprises
a semi-insulating GaAs template 11,
a buffer layer 12 (p-$Al_{0.25}Ga_{0.75}As$, thickness: 100 nm, carrier density: 1 to $200E15/cm^3$),
a buffer layer 13 (p-$Al_{0.20}Ga_{0.80}As$, thickness: 50 nm, carrier density: $2E16/cm^3$),
a back-side electron supply layer 14 (n-$Al_{0.20}Ga_{0.80}As$, thickness: 4 nm, carrier density: $3E18/cm^3$),
a back-side spacer layer 15 (p-$Al_{0.20}Ga_{0.80}As$, thickness: 3 nm, carrier density: $2E16/cm^3$),
a back-side spacer layer 16 (i-GaAs, thickness: 6 nm),
a channel layer 17 (i-$In_{0.35}Ga_{0.65}As$, thickness: 6 nm),
a front-side spacer layer 18 (i-GaAs, thickness: 6 nm),
a front-side spacer layer 19 (p-$Al_{0.20}Ga_{0.80}As$, thickness: 3 nm,
carrier density: $2E16/cm^3$),
a front-side electron supply layer 20 (n-$Al_{0.20}Ga_{0.80}As$, thickness: 6 nm, carrier density: $4E18/cm^3$), and
a Schottky layer 21 (p-$Al_{0.20}Ga_{0.80}As$, thickness: 38 nm, carrier density: $2E16/cm^3$).

The growth was performed under the conditions of a pressure in a reactor at 0.1 atm., a growth temperature at 650° C., and a growth rate of 3 to 1 μm/hr by using a low pressure barrel-typed MOCVD reactor, trimethyl gallium (TMG), trimethyl aluminum (TMA), and trimethyl indium (TMI) as group III gases, arsine ($AsH_3$) as a group V gas, disilane ($Si_2H_6$) as an n-type dopant, and high-purity hydrogen as a carrier gas.

Layers from the buffer layer 13 to the Schottky layer 21 were grown at the group V/group III material flow rate of 38.3. The buffer layer 12 was grown while the group V/group III material flow rate was changed from 11.5 to 103.2. By thus having the background p-type carrier densities different from those for other grown layers, the concentrations of the p-type carriers in the active state on both sides of the channel layer 17 were adjusted.

Figure 3:
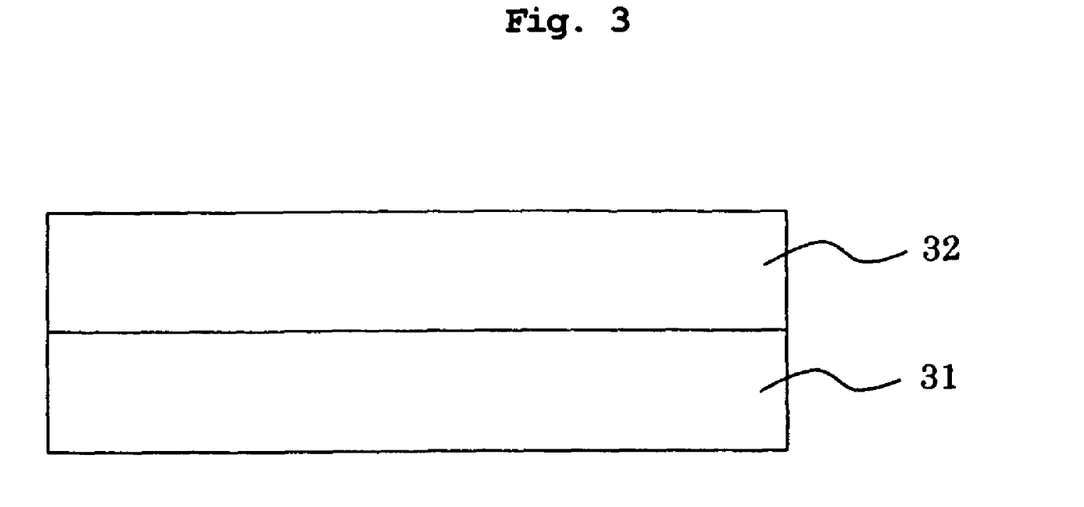
FIG. 3 illustrates a single layer structure for measuring a p-type carrier density of each layer in the compound semiconductor epitaxial substrate shown in the example.

The concentration of the p-type carriers in the active state in each layer was determined by performing a Hall measurement of a Van der Pauw method at room temperature with respect to the single crystal structure shown in FIG. 3, which is grown under the same conditions of the group V/group III material flow rate for growing each layer of the compound semiconductor epitaxial substrate of FIG. 2. Normally, the background p-type carrier densities of the GaAs layer and the InGaAs layer have values smaller by about two digits than that of the AlGaAs layer so that the background p-type carrier densities of the GaAs layer and the InGaAs layer do not need to be considered in the calculation of the total background p-type carrier concentration.

In the growth of the buffer layer 12, four types of the compound semiconductor epitaxial substrates 30 were produced by changing the group V/group III material flow rate. In addition, a total back-side p-type carrier concentration A ($/cm^2$) per unit area and a total front-side p-type carrier concentration B ($/cm^2$) per unit area were determined for each of the compound semiconductor epitaxial substrates 30. The determination results were shown in Table 1.

TABLE 1

Electron Mobility Characteristics of Compound Semiconductor Epitaxial Substrate

| total back-side p-type carrier density A ($/cm^2$) per unit area | total front-side p-type carrier density B ($/cm^2$) per unit area | A/B | room-temperature electron mobility ($cm^2$/Vsec) | room-temperature two-dimensional electron gas concentration ($/cm^2$) |
|---|---|---|---|---|
| $1.3 \times 10^{11}$ | $8.2 \times 10^{10}$ | 1.5 | 9230 | $2.58 \times 10^{12}$ |
| $1.9 \times 10^{11}$ | $8.2 \times 10^{10}$ | 2.3 | 9100 | $2.56 \times 10^{12}$ |
| $5.6 \times 10^{11}$ | $8.2 \times 10^{10}$ | 6.9 | 8850 | $2.43 \times 10^{12}$ |
| $2.08 \times 10^{12}$ | $8.2 \times 10^{10}$ | 25.3 | 8410 | $1.93 \times 10^{12}$ |

Figure 4:
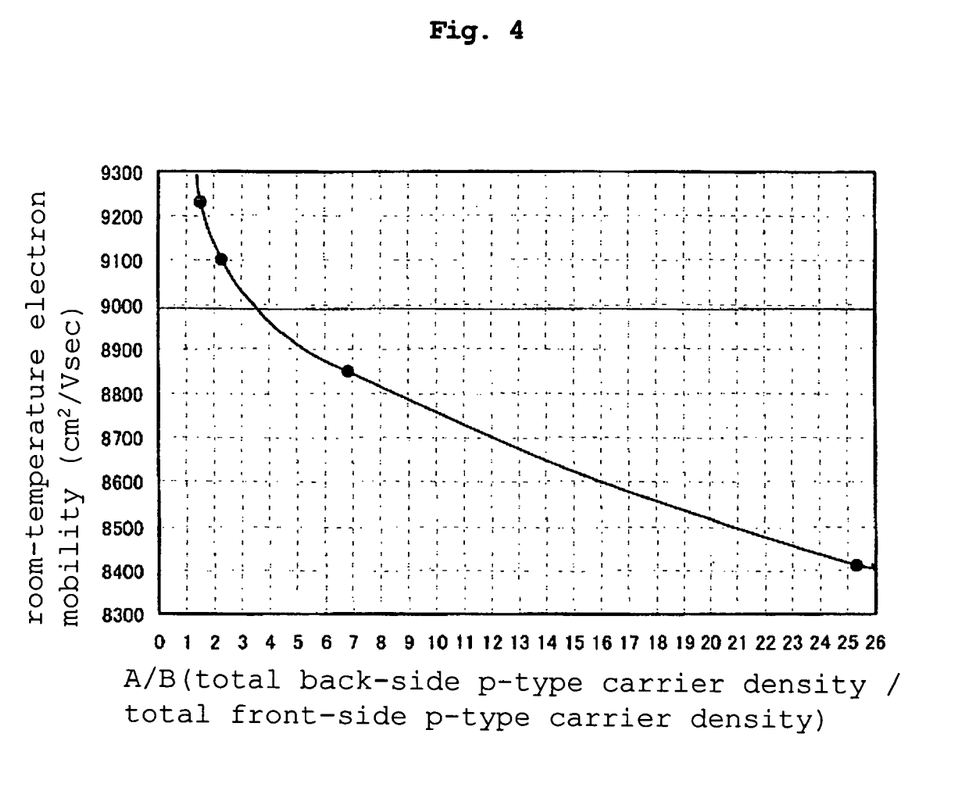
FIG. 4 shows a measurement result of an electron mobility at room temperature in the example.

In addition, the room-temperature electron mobility and the room-temperature two-dimensional electron gas concentration of the epitaxial growth substrate of FIG. 2 were measured by carrying out the Hall measurement of the Van der Pauw method at room temperature. The results were shown in Table 1. The relationship between A/B and the electron mobility was shown in FIG. 4. When the A/B was not more than 3.5, the electron mobility was not less than 9000 $cm^2$/Vs, and therefore the compound semiconductor epitaxial substrate displaying high electron mobility was obtained. The electron mobility was higher than the electron mobility of the conventional p-HEMT with the InGaAs channel grown on the GaAs substrate of 8990 $cm^2$/Vs.

In the compound semiconductor epitaxial substrate 30 shown in FIG. 3, the contact layer, which was present in the compound semiconductor epitaxial substrate for the p-HEMT, was not grown for convenience of measurement of the characteristics of the compound semiconductor epitaxial substrate. However, the substrate has the same characteristics as those of the compound semiconductor epitaxial substrate for the p-HEMT.

Industrial Applicability

In accordance with the present invention, a compound semiconductor epitaxial substrate having high mobility of electrons in a channel layer is provided. A high-performance planar device is produced by using the compound semiconductor epitaxial substrate.

The invention claimed is:

1. A compound semiconductor epitaxial substrate for a planar device, comprising:
   a channel layer in which electrons travel; and
   an epitaxial layer on each of a front side and a back side of the channel layer, wherein
   a total p-type carrier concentration A (/cm$^2$) per unit area in the epitaxial layer on the back side of the channel layer and a total p-type carrier concentration B (cm$^2$) per unit area in the epitaxial layer on the front side of the channel layer satisfy the following expression (1):

$$0 < A/B \leq 3.5 \qquad (1)$$

wherein A=(a concentration of all p-type carriers in an active state due to an acceptor impurity contained in the epitaxial layer on the back side of the channel layer)×(a total thickness of the epitaxial layer on the back side), and
   B=(a concentration of all p-type carriers in an active state due to an acceptor impurity contained in the epitaxial layer on the front side of the channel layer)×(a total thickness of the epitaxial layer on the front side).

2. The substrate of claim 1, wherein the epitaxial layer on the front side of the channel layer includes a front-side active layer and a contact layer.

3. The substrate of claim 1, wherein the epitaxial layer on the back side of the channel layer includes a buffer layer.

4. The substrate of claim 1, wherein the epitaxial layer on the back side of the channel layer includes a buffer layer and a back-side active layer.

5. A method for producing the substrate of claim 1, comprising the step of:
   growing an epitaxial layer on a template by a MOCVD method.

6. The substrate of claim 1, wherein the A/B ratio is not less than 0.5.

* * * * *